US006620555B1

United States Patent
Shigematsu

(10) Patent No.: US 6,620,555 B1
(45) Date of Patent: Sep. 16, 2003

(54) PELLICLE, METHOD OF PREPARING THE SAME AND EXPOSURE METHOD

(75) Inventor: Shigeto Shigematsu, Yamaguchi-ken (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 09/404,241

(22) Filed: Sep. 22, 1999

(30) Foreign Application Priority Data

Sep. 22, 1998 (JP) .......................................... 10/268428

(51) Int. Cl.[7] .............................. G03F 9/00; B32B 1/04; A47G 1/12
(52) U.S. Cl. ............................. 430/5; 428/14; 428/76; 355/75
(58) Field of Search ................................ 430/5; 428/14, 428/76; 355/75

(56) References Cited

U.S. PATENT DOCUMENTS 4,970,099 A * 11/1990 Adams et al. ................ 428/76
5,730,890 A * 3/1998 Bickford et al. .............. 216/87

FOREIGN PATENT DOCUMENTS

EP 0416517 A2 3/1991
EP 0416528 A 3/1991

OTHER PUBLICATIONS

Database WPI, XP002130374 and JP 06 003808A (Jan. 14, 1994) Abstract.
Database WPI, XP002130375 and JP 04 371956A (Dec. 24, 1992) Abstract.

* cited by examiner

*Primary Examiner*—Mark F. Huff
*Assistant Examiner*—Saleha R. Mohamedulla
(74) *Attorney, Agent, or Firm*—Birch, Stewart, Kolasch & Birch, LLP

(57) ABSTRACT

A pellicle that excellently transmits ultraviolet rays and, particularly, vacuum ultraviolet rays, does not lose the film thickness thereof that stems from the photolysis and, hence, exhibits excellent light resistance. The pellicle is obtained by using, as a material of pellicle film, an impurity-free organic polymer obtained by treating an organic polymer to remove at least a portion of at least any one of, preferably, a majority portion of trace amount-metal components, high molecular components and incomplete molecular structure components contained in the organic polymer. The invention further provides a method of preparing a pellicle.

2 Claims, 3 Drawing Sheets

PELLICLE, METHOD OF PREPARING THE SAME AND EXPOSURE METHOD

BACKGROUND OF THE INVENTION

1. Field of the Invention

The present invention relates to a pellicle, a method of preparing the same and an exposure method. More specifically, the invention relates to a pellicle suited for the lithography using ultraviolet rays and, particularly, vacuum ultraviolet rays, and a method of preparing the same. The invention is further related to an exposure method by using this particular pellicle.

2. Disclosure of the Prior Art

In the step of photolithography, the operation is carried out to transfer by exposure a circuit pattern onto a silicon wafer coated with a resist by using a photomask or a reticle (hereinafter referred to as "mask") having the circuit pattern which comprises a deposited film such as of chromium on the surface of a glass plate or by using a reticle. In this step, when the exposure is conducted in a state where foreign matter such as dust is adhered on the circuit pattern of the mask, the foreign matter is transferred onto the wafer resulting in the formation of a defective wafer which is a defective product. When the exposure is effected by using a stepper, in particular, the chips formed on the wafer may all become defective. Therefore, adhesion of foreign matter on the circuit pattern of the mask arouses a serious problem. In order to solve this problem, a pellicle has been developed and has been contrived in a variety of ways.

A pellicle, in general, is obtained by lining one side surface of a pellicle frame made of aluminum or the like with a transparent film of a resin such as nitrocellulose or the like, and is mounted on a mask by applying an adhesive to the other side surface thereof. This prevents the infiltration of foreign matter from the external side. Besides, even if foreign matter happens to adhere on the pellicle film, foreign matter is transferred in a blurred state by the exposure without arousing problem.

In the processing of semiconductors, it is a tendency to use a source of light having a short wavelength in order to enhance the degree of integration by forming fine patterns. It is expected that the sources of light in the vacuum ultraviolet region ($\lambda \leq 200$ nm) are most promising and among them, an ArF excimer laser ($\lambda$=193 nm) is most promising to succeed the KrF excimer laser ($\lambda$=248 nm) of which the market is now on the rise.

As the wavelength of the source of light becomes short, on the other hand, the energy of photon increases. For example, the ArF excimer laser possesses the energy of as large as 6.4 eV (=147 kcal/mol). This energy is very larger than the dissociation energy (104 kcal/mol) of the C—C bond in the organic polymer. Therefore, the polymer that absorbs light at the wavelength of the source of light easily undergoes the photolysis upon exposure to light and can no longer be used as a material of pellicle film.

On and after using the KrF lithography, therefore, there have been used fluorine-contained polymers that absorb light in relatively small amounts in the deep ultraviolet regions, such as commercially available fluorine-contained resin CYTOP (trade name) manufactured by Asahi Glass Co. and fluorine-contained resin Teflon (trade name) manufactured by du Pont Co., U.S.A.

However, even these fluorine-contained polymers absorb light in the vacuum ultraviolet region, and the thickness of the film decreases due to photolysis.

For example, the fluorine-contained resin CYTOP (film thickness of 1 $\mu$m) absorbs about 0.5% of an ArF excimer laser beam of an oscillation wavelength of 193 nm, and loses light resistance to a large extent compared with when it is irradiated with the KrF excimer laser beam.

OBJECTS AND SUMMARY OF THE INVENTION

The object of the present invention therefore is to provide a pellicle that excellently transmits ultraviolet rays and, particularly, vacuum ultraviolet rays, does not lose the film thickness thereof that stems from the photolysis and, hence, exhibits excellent light resistance, and a method of producing the same.

Another object of the present invention is to provide an exposure method, which, even when ultraviolet rays are used and, particularly, vacuum ultraviolet rays are used, does not cause the pellicle to lose light resistance that stems from the photolysis and, hence, makes it possible to form vivid and fine patterns by the lithography for relatively extended periods of time.

According to the present invention, there is provided a pellicle film obtained by using, as a material of pellicle film, an impurity-free organic polymer obtained by treating an organic polymer to remove at least a portion of or, preferably, a majority portion of at least any one of trace amount-metal components, high molecular components and incomplete molecular structure components contained in the organic polymer.

According to the present invention, there is further provided a method of preparing a pellicle film by conducting the operation for obtaining an impurity-free organic polymer by removing at least a portion of or, preferably, a majority portion of at least any one of trace amount-metal components, high molecular components and incomplete molecular structure components contained in the organic polymer, by using a filter that exhibits the adsorbing action based on the zeta potential.

According to the present invention, there is further provided a pellicle film in which the contents of trace amount-metal components in the impurity-free organic polymer are not larger than 1 ppm, respectively.

According to the present invention, it is desired that the organic polymer is a fluorine-contained resin comprising carbon (C) and fluorine (F) as chief constituent components and, particularly, is a fluorine-contained resin comprising carbon (C), fluorine (F) and oxygen (O) only as chief constituent components.

According to the present invention, there is provided an exposure method by using the pellicle film in the lithography that uses a source of light for exposure to ultraviolet rays having wavelengths over a range of from 140 to 200 nm.

As an embodiment, the invention is further concerned with a pellicle film comprising a fluorine-contained resin which contains carbon (C) and fluorine (F) as chief constituent components, the fluorine resin being treated with a soluble solvent.

It is desired that the fluorine-contained resin treated with the soluble solvent is obtained by isolating part of the dissolved fluorine-contained resin from the solution of a soluble solvent of the fluorine-contained resin in the form of a solution and/or being precipitated.

As a preferred embodiment, the thus obtained fluorine-contained resin contains metal components in amounts of not larger than 1 ppm, respectively.

It is further desired that the fluorine-contained resin used in this embodiment is treated with a soluble solvent to remove at least part of high molecular components from the fluorine-contained resin.

The pellicle films obtained by the above-mentioned various embodiments are suppressed from being subjected to the photolysis even when they are used for the lithography using ultraviolet rays as a source of light for exposure, and exhibit durability that could not be obtained so far.

That is, another embodiment of the present invention is to provide a novel pellicle film simultaneously satisfying the following conditions (a) to (c):

(a) when an ArF excimer laser beam ($\lambda$=193 nm) is irradiated under the following conditions, the total dosage before the thickness of the film is decreased by 5 nanometers (nm) is not smaller than 1420 joules/square centimeter ($J/cm^2$), preferably, from 1420 to 28400 joules/square centimeter ($J/cm^2$) and, particularly preferably, from 1420 to 14200 joules/square centimeter (J/cm2), ArF excimer laser beam irradiation conditions:

| | |
|---|---|
| pulse energy density: | 0.1 ($mJ/cm^2$)/pulse |
| repeating frequency: | 100 Hz |
| irradiated area: | 10 mm x 10 mm |
| atmosphere: | dry air flowing at a rate of 20 L/min., |

(b) the pellicle film comprises a fluorine-contained resin comprising carbon (C) and fluorine (F), or further oxygen (O), as chief constituent components; and (c) the pellicle film has a thickness of from 0.1 to 10 microns ($\mu$m).

These pellicle films are suited for the exposure method in the lithography using a source of light for exposure to ultraviolet rays having wavelengths over a range of from 140 to 200 nanometers (nm), and exhibit excellent light resistance that was not obtained so far.

The pellicle film of the present invention contains impurities in decreased amounts, exhibits excellent transmission property for the ultraviolet rays and particularly for the vacuum ultraviolet rays, suppresses the reduction in the thickness caused by the photolysis, and exhibits excellent light resistance.

The method of the present invention removes impurities that cause a drop in the ultraviolet ray transmission through a simple operation of passing the resin solution for forming the film through a filter that exhibits the adsorbing action based on the zeta potential or by effecting the precipitation using a soluble solvent.

According to the present invention, further, the pellicle little loses light resistance caused by the photolysis even when ultraviolet rays and, particularly, vacuum ultraviolet rays are used, enabling sharp and fine patterns to be formed by lithography for relatively long periods of time.

DETAILED DESCRIPTION OF THE PREFERRED EMBODIMENT

The present invention is based on a discovery that the removal of trace amount-metal components, high molecular components and incomplete molecular structure components from an organic polymer constituting the pellicle film is effective in decreasing the absorption of ultraviolet rays and, particularly, vacuum ultraviolet rays by the pellicle film and in decreasing the reduction in the thickness of the film caused by the photolysis.

The invention is further based on the discovery of the pellicle film having excellent light resistance that could not be obtained so far, owing to the treatment of the fluorine-contained resin constituting the pellicle film with a soluble solvent.

The present inventors have calculated the absorption wavelength corresponding to the molecular structure of the fluorine-contained resin (CYTOP) having the molecular structure represented by the following formula (1),

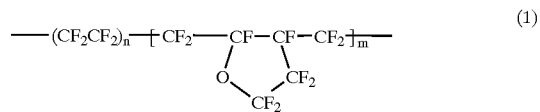

relying on the molecular orbital method. As a result of calculation, there was obtained a vacuum ultraviolet ray spectral absorption curve shown in FIG. 1 from which it is obvious that no absorption occurs at a wavelength 193 nm of ArF beam.

With the practical fluorine-contained resin, however, the film 1 $\mu$m thick absorbs light by about 0.5% as described above, and light resistance is deteriorated due to a reduction in the thickness of the film. This fact becomes readily obvious with reference to Examples and Comparative Examples appearing later.

The present inventors have conducted keen study concerning the cause that produces the difference, and have presumed that the cause is due to impurities (trace amount-metals and the like) contained in the polymers. Therefore, the inventors have removed the impurities by using a filter that exhibits the adsorbing action based on the zeta potential or have removed the impurities by the treatment with a soluble solvent to make sure a remarkable improvement in the light resistance.

Figure 2:
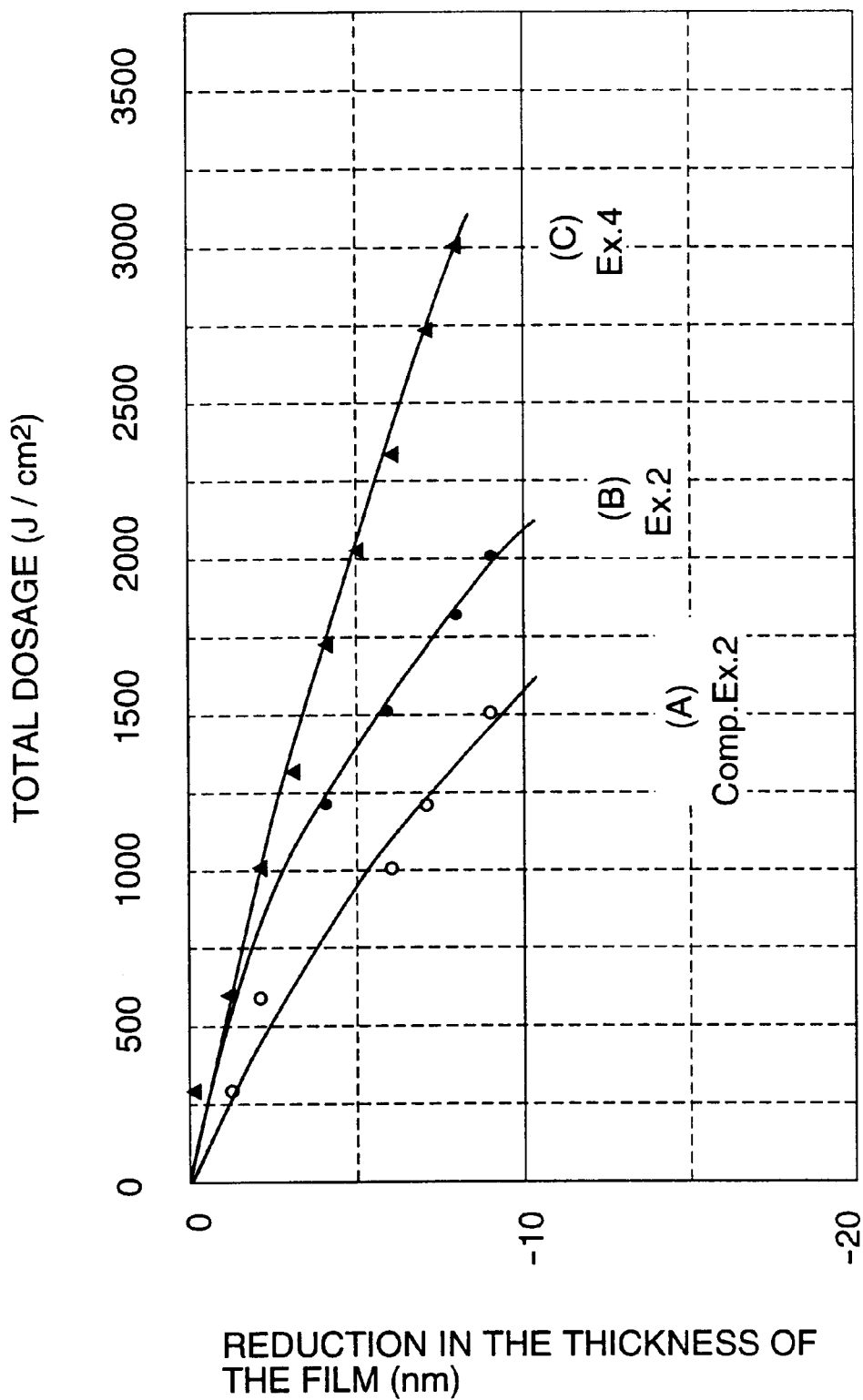
FIG. 2 is a graph plotting a relationship between the total dosage ($J/cm^2$) and the amount of reduction (nm) in the thickness of the film by using a fluorine-contained resin (○) from which the impurities are not removed, a fluorine-contained resin (●) from which the impurities are removed by using a filter that exhibits the adsorbing action upon based on the zeta potential and a fluorine-contained resin (▲) from which the impurities are moved by the treatment with a soluble solvent while projecting an ArF excimer laser of a wavelength of 193 nm.

Reference should be made to FIG. 2 in which a relationship is plotted between the total dosage ($J/cm^2$) and the reduction in the thickness of the film (nm) by using a fluorine-contained resin (○) from which the impurities are not removed, a fluorine-contained resin (●) from which the impurities are removed by using a filter that exhibits the adsorbing action based on the zeta potential and a fluorine-contained resin (▲) from which the impurities are moved by the treatment with a soluble solvent while projecting an ArF excimer laser beam of a wavelength of 193 nm.

It will be understood from these results that the removal of trace amount-metals and the like from the organic polymer is effective in suppressing the decrease in the light resistance caused by a reduction in the thickness of the film.

In the present invention, a drop in the light resistance due to the reduction in the thickness of the film is regarded to be a problem on account of the following reason. It has been known that the transmission factor of light of a particular wavelength generally varies depending upon the thickness of the film; i.e., the transmission factors for the thicknesses of the films describe a sine curve. Therefore, even when the thickness of the pellicle film is set to a predetermined value so as to exhibit a maximum transmission factor for light of a predetermined wavelength, the transmission factor decreases with a decrease in the thickness of the film resulting in the degradation of the pellicle film. In this sense, it is obvious that suppressing the reduction in the thickness of the film as much as possible is important from the standpoint of extending the life (light resistance) of the pellicle film exposed to vacuum ultraviolet rays.

The organic polymer used for the pellicle film inevitably contains trace amount-metal components due to the step of preparing the resin. Examples of the trace amount-metals include alkali metal components such as sodium and the like, alkaline earth metal components such as calcium and the like, metal components of Group 8 of periodic table such as iron, cobalt, nickel and the like, and metal components of Group 4 of periodic table such as silicon and the like, that stem from the containers, equipment, starting materials for producing the resin and subsidiary materials. In general, the amounts of these metal components could become not smaller than 3 ppm.

In the impurity-free organic polymer used in the present invention, it is desired that the trace amount-metal components are not larger than 1 ppm, respectively, from the standpoint of light resistance.

When the trace amount-metal components exceed the above-mentioned range, the organic polymer constituting the pellicle film absorbs vacuum ultraviolet rays to a degree that is no longer negligible, and light resistance is considerably deteriorated compared with that of the organic polymer that lies within the above-mentioned range.

It is further considered that the presence of high molecular components in the organic polymer causes the pellicle film to lack homogeneity and, hence, spoils the light-transmitting property of the pellicle film. The high molecular components dissolve less in a solvent than the other resin components. It is therefore considered that the presence of high molecular components causes the pellicle film to lose homogeneity in its texture. Upon removing the high molecular components, the pellicle film exhibits improved homogeneity and improved light-transmitting property.

As will be described later by way of examples, the resin in a solution treated by using a filter that exhibits adsorbing action based on the zeta potential or the resin in a solution treated with a soluble solvent, has an inherent viscosity smaller than that of the resin that is not treated, from which it is confirmed that the high molecular components have been removed.

Among them, it can be judged that the high molecular components have been removed to a sufficient degree if the degree of drop of the inherent viscosity $\eta$ is not less than 3%, usually, from 3% to 60% and, particularly, not less than 5% and, particularly desirably, from 5% to 50% with the solution of the starting resin as a reference.

In the pellicle film of the present invention, it is considered that the film comprises the fluorine-contained organic polymer. The incomplete molecular structure component in which double bonds are remained the fluorine contents are relatively small and so on among molecules constituting the fluorine-contained organic polymer might cause the photolysis upon exposure to light, and that the thickness of the pellicle film decreases due to the photolysis whereby the light resistance of the pellicle film decreases. Accordingly, in the present invention, the light resistance is improved by removing such incomplete molecular structure component from the fluorine-contained organic polymer.

According to the present invention, some impurities such as trace amount-metals, high molecular components and incomplete molecular structure components contained in the organic polymer, can be effectively removed by passing the organic polymer through a filter that exhibits the adsorbing action based on the zeta potential or by treating the organic polymer with a soluble solvent prior to preparing the film.

The zeta ($\zeta$) potential is also called interfacial electrokinetic potential, and is defined as a potential difference occurring in the interface between a solid (dispersing phase) and a liquid (dispersing medium) that are contacting to each other and are moving relative to each other. An electric double layer is generally formed in the interface between the solid and the liquid. In the electric double layer, a solid phase (or adsorbing layer) exists in a portion close to the solid to which are adhering ions of an electric charge opposite to that of the surface of the solid. When the solid and the liquid move relative to each other, it is considered that the potential difference that really dominates the motion is the potential difference between the surface of the solid phase and the interior of the solution (diffusing phase), since the solid phase moves together with the solid.

Concerning the electric charge of the dispersing phase, it has been said that when the dispersing medium and the dispersing phase have different dielectric constants, the one having a larger dielectric constant is positively charged and the one having a smaller dielectric constant is negatively charged.

Figure 3:
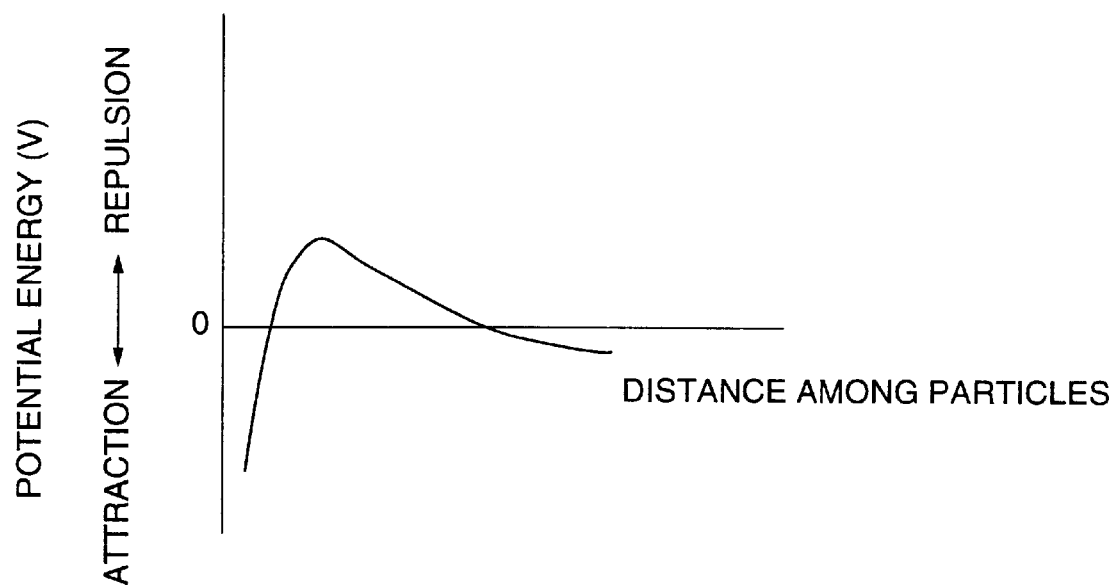
FIG. 3 is a diagram illustrating a relationship between the potential energy for the colloidal particles (ordinate) and the distance among the colloidal particles (abscissa).

In general, two forces, i.e., the zeta ($\zeta$) potential and van der Waals are acting on the colloidal particles of the same kind (same electric charge) dispersing in the organic polymer solution, the former one acting as a repulsion and the latter one acting as an attraction. Here, referring to FIG. 3, the potential energy for the colloidal particles is represented by the ordinate, the distance among the colloidal particles is represented by the abscissa, and it is presumed that the potential energy higher than the origin 0 (zero) produces repulsion and the potential energy lower than the origin 0 (zero) produces an attraction. This state is considered to be as schematically illustrated in FIG. 3. That is, the colloidal particles that are brought close to each other from the sufficiently separated positions, are suppressed from approaching any more due to the barrier (B) created by the zeta potential. Therefore, the colloidal particles are not coagulated but remain stable.

On the other hand, when the organic polymer is passed through the filter that exhibits the adsorbing action based on zeta potential, the colloidal particles are effectively removed due to the adsorbing action of the colloidal particles having a charge opposite to zeta potential of the filter and the double trapping action based on the mechanical filtration.

In the case of the fluorine-contained resin comprising carbon (C) and fluorine (F) as chief constituent components, there is obtained the pellicle film of fluorine-contained resin having excellent light resistance that could not be obtained so far through the treatment of the fluorine-contained resin with the soluble solvent inclusive of the operation for removing at least any one of trace amount-metal components, high molecular components and components of incomplete molecular structures.

It is desired that the fluorine-contained resin treated with the soluble solvent is obtained by isolating part of the dissolved fluorine-contained resin from the solution of a soluble solvent of the fluorine-contained resin in the form of a solution and/or being precipitated. It is desired that the amount of fluorine-contained resin component isolated and removed in the form of a solution is not larger than 60% by weight and, desirably, from 3 to 60% by weight and, particularly, from 5 to 50% by weight of the whole amount.

Desirably, the thus obtained fluorine-contained resin contains the metal components in amounts of not larger than 1 ppm, respectively.

In this case, it is desired to use the fluorine-contained resin from which are removed at least any one of trace amount-metal components, high molecular components and components of incomplete molecular structures by the treatment with a soluble solvent.

The high molecular components can be removed, usually, by adding a bad solvent to the solution of the fluorine-contained resin to separate by precipitation the dissolved fluorine-contained resin in addition to using the filter that exhibits the adsorbing action based on the zeta potential. It is therefore desired to decrease the limiting viscosity (grams/deciliter) by more than 3% and, usually, by about 5 to about 50% compared to the limiting viscosity (grams/deciliter) of the fluorine-contained resin of before being isolated.

According to the present invention, there is provided a pellicle simultaneously satisfying the following conditions (a) to (c):

(a) when the ArF excimer laser beam ($\lambda$=193 nm) is irradiated under the following conditions, the total dosage before the thickness of the film is decreased by 5 nanometers (nm) is not smaller than 1420 joules/square centimeter (J/cm$^2$), preferably, from 1420 to 28400 joules/square centimeter (J/cm$^2$) and, particularly preferably, from 1420 to 14200 joules/square centimeter (J/cm$^2$),

| | |
|---|---|
| pulse energy density: | 0.1 (mJ/cm$^2$)/pulse |
| repeating frequency: | 100 Hz |
| irradiated area: | 10 mm × 10 mm |
| atmosphere: | dry air flowing at a rate of 20 L/min., |

(b) the pellicle film comprises a fluorine-contained resin comprising carbon (C) and fluorine (F), or further oxygen (O), as chief constituent components; and (c) the pellicle film has a thickness of from 0.1 to 10 microns ($\mu$m).

By using the pellicle films obtained by the embodiments of the present invention, there is provided an exposure method which is used for the lithography using a source of light for exposure to ultraviolet rays having wavelengths over a range of from 140 to 200 nanometers (nm).

[Pellicle Film and Method of Its Preparation]

Though there is no particular limitation, it is desired that the organic polymer for pellicle used in the present invention is a fluorine-contained resin comprising carbon (C) and fluorine (F) as chief constituent components and, particularly, a fluorine-contained resin comprising carbon (C), fluorine (F) and oxygen (O) only as constituent components.

Among the above-mentioned fluorine-contained resins, it is desired to use a perfluoro amorphous fluorine-contained resin having a cyclic structure and, particularly, a cyclic ether structure on the main chain. A suitable example of the perfluoro amorphous fluorine-contained resin is a perfluoro fluorine-contained resin containing, in the main chain, at least one of the recurring unit represented by the following formula (2),

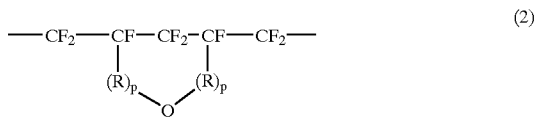

R: perfluoroalkylene group,
p: a number of 0 or 1,
q: a number of 0, 1 or 2,
a recurring unit represented by the following formula (3),

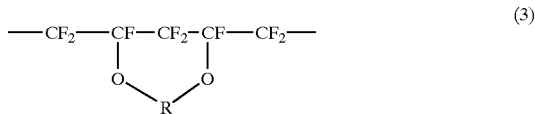

R: perfluoroalkylene group,
a recurring unit of the following formula (4),

R: perfluoroalkylene group,
a recurring unit of the following formula (5),

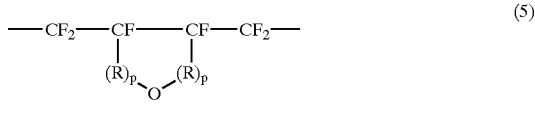

R: perfluoroalkylene group,
p: a number of 0 or 1,
q: a number of 0, 1 or 2,
a recurring unit of the following formula (6),

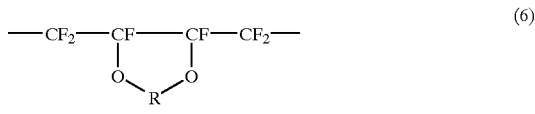

R: perfluoroalkylene group,

In the perfluoro fluorine-contained resin, the recurring units may all comprise the cyclic recurring units or the recurring units may partly comprise the cyclic recurring units and the remaining recurring units may comprise linear perfluoro monomer units.

The perfluoro amorphous fluorine-contained resin can be obtained by a method known per se, such as the cyclization polymerization of a perfluoroether monomer having double bonds at both terminals or the radical polymerization of a cyclic perfluoro monomer. In conducting the polymerization, another perfluoro monomer may be made present to obtain a copolymer.

As the perfluoroether monomer having double bonds at both terminals, there can be exemplified a perfluoroether represented by the following formula (7),

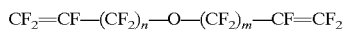

(7)

(n=1 to 5, m=1 to 5, n+m=1 to 6)
such as perfluoroallylvinyl ether, perfluorodiallyl ether, perfluorobutenylvinyl ether, perfluorobutenylallylvinyl ether, perfluorodibutenyl ether, etc.

The perfluoroether monomer having double bonds at both terminals of another type will be a perfluoroalkylene glycol divinyl ether represented by the following formula (8),

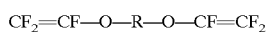

(8)

R: perfluoroalkylene group, such as perfluoroethylene glycol divinyl ether, perfluorotetramethylene glycol divinyl ether, etc.

As the cyclic perfluoro monomer, there can be exemplified a monomer represented by the following formula (9),

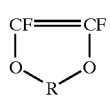

(9)

R: perfluoroalkylene group, and, particularly, perfluoro-2,2-dimethyl-1,3-dioxole.

As another monomer used for the copolymerization, there can be exemplified tetrafluoroethylene, hexafluoropropylene, perfluorovinylpropyl ether, perfluoroallylbutyl ether, perfluorodivinylethyl ether, perfluorovinylallyl ether, etc.

Though there is no particular limitation, concrete examples of the amorphous fluorine-contained resin include a cyclized copolymer of tetrafluoroethylene and perfluorovinylallyl ether such as CYTOP (trade name, manufactured by Asahi Glass Co.) represented by the above-mentioned formula (1), and a copolymer of tetrafluoroethylene and perfluoro-2,2-dimethyl-1,3-dioxole such as Teflon AF (trade name, manufactured by du Pont Co., U.S.A. and Mitsui-du Pont Fluorochemical Co.) represented by the following formula (10),

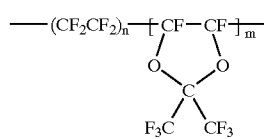

(10)

To prepare the pellicle, the organic polymer is dissolved in a suitable solvent to prepare a solution thereof. In the case of the above-mentioned fluorine-contained resin, the solvent is an organic solvent of the fluorine type and, particularly, an organic solvent of the perfluoro type, such as perfluoro(2-butyltetrahydrofuran), perfluoro(2-propyltetrahydropyran), perfluorohydrofuran, perfluorooctane, etc.

Generally, the concentration of the organic polymer in the solution is desirably from 1 to 20% by weight and, particularly, from 2 to 10% by weight from the standpoint of removing trace amount-metal components and trace amounts of colloidal components and preparing the film. When the concentration becomes smaller than the above-mentioned range, the efficiency decreases for forming the film and for removing the impurities. When the concentration exceeds the above-mentioned range, on the other hand, the viscosity of the solution becomes so high that the operability decreases for forming the film and for removing the impurities.

According to the present invention, the organic polymer solution is filtered by using a filter that exhibits the adsorbing action based on the zeta potential or is treated with a soluble solvent to remove trace amount-metal components or trace amounts of colloidal components from the organic polymer solution.

As the filter, there can be exemplified any known porous material for solid-liquid separation, such as woven fabric or nonwoven fabric of fibers, porous membrane or plate, layer filled with powdery particles, porous molded article, or a combination of two or more thereof provided at least part thereof exhibits the adsorbing action based on the zeta potential.

As the fiber for forming filter, there can be used a woven fabric or a nonwoven fabric comprising one or two or more kinds of natural fiber, regenerated fiber, synthetic fiber and inorganic fiber.

As the natural fiber, there can be exemplified cellulose fibers such as pulp fiber, cotton, rammy, etc. and animal fibers such as wool, etc. As the regenerated fiber, there can be exemplified a regenerated cellulose fiber and acetate fiber produced by the viscose method or the cupro-ammonium method.

As the synthetic fiber, there can be exemplified an olefin resin comprising polyethylene or polypropylene, a polyvinyl alcohol fiber, polyvinyl chloride fiber, vinylidene chloride resin fiber, acrylic fiber, vinyl chloride-vinylidene chloride copolymer fiber, polyamide fiber such as nylon 6 or nylon 6-6, a thermoplastic polyester fiber such as polyethylene terephthalate, a fluorine-contained resin fiber such as polytetrafluoroethylene, as well as an aramid fiber and a liquid crystal polyester fiber.

As the inorganic fiber, there can be exemplified a glass fiber, a ceramic fiber, a carbon fiber, and a natural or synthetic mineral fiber. Though not limited thereto only, suitable examples of the mineral fiber include calcium silicate fiber, magnesium silicate fiber, basic magnesium silicate fiber such as sepiolite and asbestos.

The fiber for constituting the filter may be used in a single kind or in a combination of two or more kinds. Besides, the form of the fiber may be a staple fiber or a filament fiber. Though there is no particular limitation, the thickness of the single fiber is usually not larger than 100 denier and, particularly, not larger than 50 denier.

As the porous film, there can be used the one produced by a means known per se, such as microphase separation method, drawing method or electric charge track etching method. According to the microphase separation method, a homogeneous solution obtained by dissolving high molecules such as cellulose acetate, cellulose nitrate, polyvinyl chloride, polyacrylonitrile, polysulfone, polyethersulfone, polyethylene, polypropylene, polyvinylidene fluoride or polyphenylene oxide in a solvent, is thinly spread and is then immersed in a non-solvent which does not dissolve high molecules. Or, the solvent is vaporized from the high molecular solution that is spread to form a porous film. According to the drawing method, a film such as of polytetrafluoroethylene or polypropylene is drawn at a high temperature and is heat-treated to obtain a porous film. According to the electric charge track etching method, the high molecular film is irradiated with thermal neutrons and the damaged portions are selectively subjected to the chemical etching to obtain a porous film.

The porous film includes an inorganic film, for example, an alumina film and a zirconia film.

As the filler layer, there can be used diatomaceous earth, perlite, activated carbon or talc, which is adhesive, porous, and is not restricted by the filtering operation.

As the porous molded article, further, there can be used a ceramic sintered product such as biscuit sheet or Alundum, or a molded article obtained by integrally molding the fibrous filter members, porous films or filler layers that are laminated in a plural number under the application of heat.

The zeta potential of the filtering material in the filter is usually determined by the filtering material. As for the inorganic filtering material, the siliceous filtering material tends to possess zeta potential of the negative polarity whereas the aluminous filtering material and the filtering material of a metal silicate (inclusive of basic metal silicate) tend to possess zeta potential of the positive polarity.

The zeta potential of the organic high molecular filtering material is controlled by forming at least part of the organic high molecules using a copolymer resin having an anionic or cationic polar group, or by blending the organic high molecules with a copolymer resin having the polar group. As the anionic polar group, there can be exemplified any polar group such as carboxylic acid, sulfonic acid or phosphonic acid. As the cationic polar group, there can be exemplified any cationic group such as basic nitrogen-containing group like primary, secondary or tertiary amino group, quaternary ammonium group, amido group, imino group, imido group, hydrazino group, guanidino group or amidino group.

The copolymer resin having anionic or cationic polar group is obtained by incorporating a monomer having anionic or cationic polar group in a resin by the random copolymerization, block copolymerization or graft copolymerization.

Suitable examples of the monomer are as described below.

As the monomers of the carboxylic acid type, there can be exemplified ethylenically unsaturated carboxylic acid such as acrylic acid, methacrylic acid, crotonic acid, maleic acid, maleic anhydride, fumaric acid, and lower alkyl half esters of maleic acid or fumaric acid.

As the monomers of the sulfonic acid type, there can be exemplified styrenesulfonic acid, and 2-acrylamide-2-methylpropanesulfonic acid.

As the monomers of the phosphonic acid type, there can be exemplified 2-acidphosphoxypropyl methacrylate, 2-acidphosphoxyethyl methacrylate and 3-chloro-2-acidphosphoxypropyl methacrylate.

As the basic nitrogen-containing (meth)acrylic monomer, there can be exemplified dimethylaminoethyl methacrylate, dimethylaminoethyl acrylate, diethylaminoethyl methacrylate, diethylaminoethyl acrylate, dimethylaminopropyl methacrylate, dimethylaminopropyl acrylate, dibutylaminoethyl methacrylate, dimethylaminopropyl methacrylamide, N,N-dimethylaminoethyl-N'-aminoethyl methacrylate, 3-acrylamide-3,3'-dimethylpropyl dimethylamine, and quaternary ammonium salt thereof.

As the cationic polar group-containing vinyl monomer, there can be exemplified diallyldimethylammonium chloride, vinyltrimethylammonium chloride, N-vinylcarbazole, 2-vinylimidazole, N-vinylpyrrole, N-vinylindole, N-vinylpyrrolidone, and quaternary vinylpyridinium.

Depending on the kind of impurities to be removed, the filter used in the present invention may exhibit the adsorbing action based on the negative zeta potential, may exhibit the adsorbing action based on the positive zeta potential, or may exhibit the adsorbing action based on the negative and positive zeta potentials.

The filter that exhibits the adsorbing action based on the zeta potential has been placed in the market in the trade name of Zeta Plus or Zeta Pore (both are registered trademarks) by Cuno Co., and is easily available.

It is desired that the impurities are removed by repetitively circulating the resin solution for forming pellicle film through the above-mentioned filter until the content of impurities is lowered down to a predetermined level. In general, the filtering pressure is from 0.1 to 2.45 kg/cm$^2$ (gauge), but the temperature is not particularly limited and may generally be normal temperature. As required, however, the resin solution may be heated or cooled.

Prior to being passed through, or after having been passed through, the filter that exhibits the adsorbing action based on the zeta potential, further, the resin solution may be prefiltered or postfiltered using another filter. Or, the resin solution may be filtered through a plurality of stages using filters that exhibit the adsorbing action based on the zeta potential.

In the case of the fluorine-contained resin comprising carbon (C) and fluorine (F) as chief constituent components, in particular, there is obtained a pellicle film of the fluorine-contained resin having excellent light resistance, which could not be obtained so far, by the treatment with the soluble solvent of the fluorine-contained resin or by the above-mentioned operation for removing at least part of or, desirably, the majority portion of the trace amount-metal components and/or high molecular components and/or incomplete molecular structure components.

As the fluorine-contained resin treated with the soluble solvent, there can be used the fluorine-contained resin obtained by isolating part of the dissolved fluorine-contained resin from the solution of a soluble solvent of the fluorine-contained resin in the form of a solution and/or being precipitated. To remove the high molecular components, further, the dissolved fluorine-contained resin is usually isolated by precipitation by adding a bad solvent to the solution of the fluorine-contained resin or by changing the temperature of the solution in addition to using the filter that exhibits the adsorbing effect based on the zeta potential.

The pellicle film is formed by using the organic polymer which is the fluorine-contained resin obtained by the treatment with a soluble solvent or by the operation for removing impurities relying upon the flow-spread film-forming method that is known per se, such as spin-coating method or knife-coating method. In general, the resin solution is permitted to flow and spread on the surface of a smooth substrate such as glass plate to form a thin film. The thickness of the thin film that is formed can be easily changed by changing the viscosity of the solution and the rotational speed of the substrate.

The thin film formed on the substrate is dried by such means as the hot air or the irradiation with infrared rays to remove the remaining solvent.

It is usually desired that the thickness of the pellicle is from 0.1 to 10 $\mu$m so as to exhibit a high transmission factor for the wavelength of the vacuum ultraviolet rays, and is usually from 0.5 to 1 $\mu$m for the wavelength 193 nm of ArF beam.

The pellicle film of the present invention can be used in its form and can also be used by forming an inorganic or organic reflection-preventing film known per se on one surface or on both surfaces of the film.

[Pellicle and Lithography]

The pellicle used for the exposure method of the present invention is obtained by lining one side of the pellicle frame with the pellicle film obtained by the above-mentioned method, and by applying an adhesive or by sticking a double-sided adhesive tape onto the other side of the pellicle frame, so that it can be attached on the mask.

Though there is no particular limitation, the pellicle frame is made of a metal such as aluminum, aluminum alloy or stainless steel, or synthetic resin or ceramics.

Further, the pellicle frame is lined with the pellicle film with a known adhesive such as silicon resin-type adhesive or fluorine resin-type adhesive.

The pellicle of this structure prevents the infiltration of foreign matter from the external side. Even in case foreign matter adheres on the film, it is transferred in a blurred state through the exposure and no problem arouses.

In order to prevent the generation of dust within the pellicle, a layer of a known adhesive material may be formed on the inner surfaces of the pellicle frame and on the inner surfaces of te pellicle film. That is, with the adhesive layer being formed on the inside of the pellicle frame and on the inside of the film, dust is prevented from being generated in the pellicle, and the floating dust is secured and is prevented from adhering onto the mask.

According to the exposure method of the present invention, the pellicle equipped with the pellicle film prepared according to the above-mentioned method is mounted on a photomask or a reticle having a circuit pattern of a deposited film such as of chromium formed on the surface of a glass plate, and the circuit pattern is transferred by exposure onto the silicon wafer coated with the resist by using a source of light for exposure to ultraviolet rays having a wavelength over a range of from 140 to 200 nm.

According to the present invention, the pellicle little loses light resistance due to photolysis even when ultraviolet rays are used and, particularly, even when vacuum ultraviolet rays are used and, as a result, sharp and fine patterns can be stably formed by lithography for relatively extended periods of time.

EXAMPLE

The invention will be further described by way of Examples.

Example 1

A fluorine-contained polymer resin CYTOP (of a grade of highly transmitting ultraviolet rays, manufactured by Asahi Glass Co.) was dissolved in a fluorine solvent F-top EF-L174 (produced by Tochem Products Co.) to prepare a solution containing 4% by weight of the fluorine-contained polymer.

Next, the solution was circulated and filtered under the following conditions.

| Filter material: | Zeta Plus Filter (EC 050, produced by Cuno Co.) |
| --- | --- |
| Flow rate: | 4 ml/min |
| Filtering time: | 10 days |

The solution of the fluorine-contained polymer after filtered was dried at 120° C. for 12 hours under reduced pressure to recover a dry fluorine-contained polymer.

About 1 g of the fluorine-contained polymer was burned, and the residue was analyzed by the ICP method to measure the amounts of metals contained in the fluorine-contained polymer. The results were as shown in Table 1.

The amounts of metal components in the fluorine-contained polymer were all smaller than a detectable limit of 1 ppm.

Further, the inherent viscosity [η] of the fluorine-contained polymer refined by filtration was found by the limiting viscosity method (solvent: F-Top EF-L102 manufactured by Tochem Products Co.) to be 0.56 (dl/g).

Comparative Example 1

A dry fluorine-contained polymer was recovered in quite the same manner as in Example 1 but without circulating the fluorine-contained polymer solution through the Zeta Plus Filter. The fluorine-contained polymer was analyzed for the presence of metal components in the same manner as in Example 1.

The obtained results were as shown in Table 1.

Sodium and calcium that were not detected in Example 1 were detected. It was therefore confirmed that these metal components were removed by circulating the fluorine-contained polymer solution through the Zeta Plus Filter.

The inherent viscosity of the fluorine-contained polymer of Comparative Example 1 was measured in the same manner as in Example 1 to be 0.60, proving that the molecular weight was higher than that of the fluorine-contained polymer that was filtered through the Zeta Plus Filter. It was thus confirmed that the high molecular components of the fluorine-contained polymer were removed by the Zeta Plus Filter.

Comparative Example 2

Among the fluorine-contained polymer solutions prepared in Example 1, use was made of the one that was not filtered through the Zeta Plus Filter to prepare a fluorine-contained polymer film (pellicle film) having a thickness of 0.8 μm by the spin-coating method. The obtained film was irradiated with an ArF excimer laser beam (λ=193 nm) under the following conditions. Laser beam irradiation conditions:

| Pulse energy density: | 0.1 (mJ/cm$^2$)/pulse |
| --- | --- |
| Repeating frequency: | 100 Hz |
| Irradiation area: | 10 mm × 10 mm |
| Atmosphere: | dry air flowing at a rate of 20 L/min. |

A curve (A) in FIG. 2 represents a relationship between the total dosage of the ArF excimer laser beam and the amount of reduction in the thickness of the fluorine-contained polymer film caused by the irradiation with the laser beam.

Figure 1:
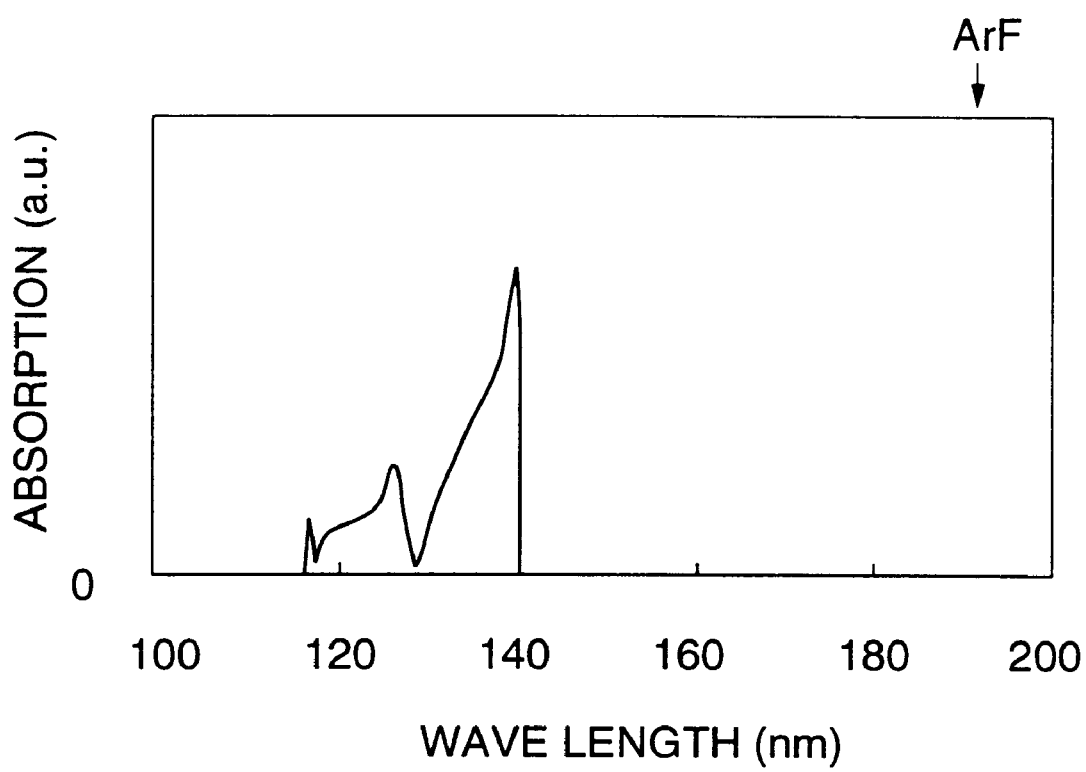
FIG. 1 is an ultraviolet spectral absorption curve representing the calculated results of the absorption wavelengths of the fluorine-contained resin of the chemical structure represented by the formula (1) relying on the molecular trajectory method, the calculated results corresponding to the molecular structures.

If the reduction in the thickness of the film of 5 nm is presumed to be the service life of the pellicle film which is the fluorine-contained polymer film in FIG. 1, then, it is learned that the pellicle film has a light resistance (life) of 960 J/cm$^2$.

Example 2

A fluorine-contained polymer film (pellicle film) was prepared in quite the same manner as in Comparative Example 2 but using the fluorine-contained polymer solution filtered through the Zeta Plus Filter among the fluorine-contained polymer solutions prepared in Example 1, and was irradiated with the ArF excimer laser beam to measure the amount of reduction in the thickness of the film.

The total dosage was 1420 J/cm$^2$ before the amount of reduction in the thickness of the film reached 5 nm, from which it was learned that the light resistance was lengthened by about 1.5 times compared to that of Comparative Example 2.

Example 3

A solution (the first solution) containing 4% by weight of the fluorine-contained polymer was prepared in the same manner as Example 1 but using Perfload IL 263 (produced by Tokuyama Co.) as the fluorine solvent.

Next, impurities were removed with a soluble solvent in a manner as described below by using m-XHF (metaxylene hexafluoride) as a bad solvent.

① The m-XHF was dropwisely added to the solution containing 4% by weight of the fluorine-contained polymer at a volume ratio of 0.80 to 1 of the fluorine-contained polymer solution, and the supernatant solution was extracted (precipitated portion was removed in an amount of 24.1% by weight of the fluorine polymer in the first solution).

② The supernatant solution obtained in ① above was dropwisely added to the m-XHF at a ratio of 0.73 to 1 of the m-XHF, and the precipitated portion was extracted and the unprecipitated portion was removed. The unprecipitated portion contained the fluorine polymer in amount of 3.8% by weight with respect to the fluorine polymer in the first solution.

The precipitated portion obtained in ② was dried in quite the same manner as in Example 1 to recover the dried fluorine-contained polymer. The fluorine-contained polymer was analyzed for the presence of metal components in the same manner as in Example 1.

The obtained results were as shown in Table 1.

Though the sodium and calcium were detected in Comparative Example 1, the amounts of Na and Ca were smaller than the detectable limit in Example 3. From the results, it was confirmed that the metal components had been removed by the treatment with the soluble solvent.

The inherent viscosity of the fluorine-contained polymer of Example 3 was measured in the same manner as in Example 1 to be 0.44, proving that the molecular weight was smaller than that of the fluorine-contained polymer of Comparative Example 1, from which it was confirmed that the high molecular components of the fluorine-contained polymer were removed by the treatment with the soluble solvent.

Example 4

The precipitated portion obtained in ② of Example 3 was dissolved in a fluorine solvent Perfload IL-263 to prepare a solution containing 4% by weight of the fluorine-contained polymer.

A fluorine-contained polymer film (pellicle film) was prepared in quite the same manner as in Comparative Example 2 but using the above solution, and was irradiated with the ArF excimer laser beam to measure the amount of reduction in the thickness of the film. The results were as shown in FIG. 2(c).

The total dosage was 2080 J/cm$^2$ before the amount of reduction in the thickness of the film reached 5 nm, from which it was learned that the light resistance was lengthened by more than 2 times compared to that of comparative Example 2.

TABLE 1

(unit in ppm)

| Element | Example 1 | Comparative Example 1 | Example 3 |
|---|---|---|---|
| Ag | <1 | <1 | <1 |
| Al | <1 | <1 | <1 |
| As | <1 | <1 | <1 |
| Ba | <1 | <1 | <1 |

TABLE 1-continued (unit in ppm)

| Element | Example 1 | Comparative Example 1 | Example 3 |
|---|---|---|---|
| Ca | <1 | 2.9 | <1 |
| Cd | <1 | <1 | <1 |
| Ce | <1 | <1 | <1 |
| Co | <1 | <1 | <1 |
| Cr | <1 | <1 | <1 |
| Cu | <1 | <1 | <1 |
| Fe | <1 | <1 | <1 |
| Ga | <1 | <1 | <1 |
| Ge | <1 | <1 | <1 |
| Hf | <1 | <1 | <1 |
| La | <1 | <1 | <1 |
| Li | <1 | <1 | <1 |
| Mg | <1 | <1 | <1 |
| Mn | <1 | <1 | <1 |
| Mo | <1 | <1 | <1 |
| Na | <1 | 4.8 | <1 |
| Ni | <1 | <1 | <1 |
| P | <1 | <1 | <1 |
| Pb | <1 | <1 | <1 |
| Pd | <1 | <1 | <1 |
| Sb | <1 | <1 | <1 |
| Se | <1 | <1 | <1 |
| Si | <1 | <1 | <1 |
| Sn | <1 | <1 | <1 |
| Sr | <1 | <1 | <1 |
| Ti | <1 | <1 | <1 |
| V | <1 | <1 | <1 |
| Zn | <1 | <1 | <1 |
| Zr | <1 | <1 | <1 |

What is claimed is:

1. A pellicle film comprising a purified fluorine-containing resin from which is removed a majority portion of at least any one of trace amount impurity metal components, high molecular components and incomplete molecular structure components from a raw material fluorine-contained resin, by using a filter which exhibits adsorbing action based on the zeta potential, or by using a soluble solvent which can dissolve the fluorine-contained resin, wherein any one of said impurity metal components residually contained in said purified resin is not more than 1 ppm, and wherein said pellicle film simultaneously satisfying the following conditions (a) to (c):

(a) when an ArF excimer laser beam ($\lambda$=193 nm) is irradiated under the following conditions, the total dosage before the thickness of the film is decreased by 5 nanometers (nm) is not smaller than 1420 joules/square centimeter (J/cm$^2$), ArF excimer laser beam irradiation conditions:

| | |
|---|---|
| pulse energy density: | 0.1 (mJ/cm$^2$)/pulse |
| repeating frequency: | 100 Hz |
| irradiated area: | 10 mm × 10 mm |
| atmosphere: | dry air flowing at a rate of 20 L/min., |

(b) the fluorine-contained resin comprises carbon (C) and fluorine (F) or further oxygen (O) as chief constituent components; and (c) the pellicle film has a thickness of from 0.1 to 10 μm.

2. A pellicle film comprising a uniformly purified fluorine-containing resin from which is removed a majority portion of at least any one of trace amount impurity metal components, high molecular components and incomplete molecular structure components from a raw material fluorine-contained resin, by using a filter which exhibits adsorbing action based on the zeta potential, or by using a soluble solvent which can dissolve the fluorine-contained resin, wherein any one of said impurity metal components residually contained in said purified resin is not more than 1 ppm, and wherein said pellicle film simultaneously satisfying the following conditions (a) to (c):

(a) when an ArF excimer laser beam ($\lambda=193$ nm) is irradiated under the following conditions, the total dosage before the thickness of the film is decreased by 5 nanometers (nm) is not smaller than 1420 joules/square centimeter (J/cm$^2$), ArF excimer laser beam irradiation conditions:

| | |
|---|---|
| pulse energy density: | 0.1 (mJ/cm$^2$)/pulse |
| repeating frequency: | 100 Hz |
| irradiated area: | 10 mm × 10 mm |
| atmosphere: | dry air flowing at a rate of 20 L/min., |

(b) the fluorine-contained resin comprises carbon (C) and fluorine (F) or further oxygen (O) as chief constituent components; and (c) the pellicle film has a thickness of from 0.1 to 10 μm.

* * * * *